United States Patent [19]

Possin et al.

[11] Patent Number: 5,130,263
[45] Date of Patent: Jul. 14, 1992

[54] METHOD FOR PHOTOLITHOGRAPHICALLY FORMING A SELFALIGNED MASK USING BACK-SIDE EXPOSURE AND A NON-SPECULAR REFLECTING LAYER

[75] Inventors: George E. Possin; Siegfried Aftergut, both of Schenectady, N.Y.

[73] Assignee: General Electric Company, Schenectady, N.Y.

[21] Appl. No.: 510,767

[22] Filed: Apr. 17, 1990

[51] Int. Cl.$^5$ ............... H01L 21/336; H01L 21/312; G03C 5/16
[52] U.S. Cl. ..................... 437/40; 437/101; 437/229; 430/311; 430/317; 430/319; 430/395
[58] Field of Search ............ 437/41, 40, 101, 229; 156/643, 662, 663, 659.1; 430/311, 317, 319, 271, 273, 395, 326, 323; 357/2, 4, 23.7

[56] References Cited

U.S. PATENT DOCUMENTS

| | | | |
|---|---|---|---|
| 4,332,879 | 6/1982 | Pastor et al. | 430/311 |
| 4,543,320 | 9/1985 | Vijan | 156/643 |
| 4,544,623 | 10/1985 | Audykowski et al. | 430/273 |
| 4,548,894 | 10/1985 | Lynch et al. | 430/273 |
| 4,740,439 | 4/1988 | Tachikawa et al. | 430/273 |
| 4,780,402 | 10/1988 | Remmington | 430/271 |
| 4,898,804 | 2/1990 | Rauschenbach et al. | 430/311 |
| 5,010,027 | 4/1991 | Possin et al. | 437/41 |

FOREIGN PATENT DOCUMENTS

| | | | |
|---|---|---|---|
| 0223121 | 11/1985 | Japan | 430/271 |
| 0224223 | 11/1985 | Japan | 430/271 |

OTHER PUBLICATIONS

K. Asama et al., "A Self-Alignment Processed a-Si TFT Matrix Circuit for LCD Panels", SID 83 Digest, pp. 144–145.
B. Diem et al., "a-Si:H TFT:Potential Suitabilities for Gate and Source-Drain Self-Aligned Structure", Mat. Res. Soc. Symp. Proc., vol. 33, pp. 281–285 (1984), Elsevier Science Pub. Co., Inc.

Primary Examiner—Mary Wilczewski
Attorney, Agent, or Firm—Donald S. Ingraham; James C. Davis, Jr.; Marvin Snyder

[57] ABSTRACT

A method for photolithographically forming a mask includes the steps of: forming an island structure of opaque material on a principal surface of a transparent substrate; depositing at least one layer of transparent material on the principal substrate surface and over the island structure; depositing a layer of photoresist material over the at least one transparent layer; exposing a back-side substrate surface, opposite to the principal substrate surface, to UV light to cause exposure of at least a portion of the photoresist, corresponding substantially to an area outside of a shadow of the island structure; reflecting at least a portion of UV light back into the photoresist layer, by depositing a non-specular layer over the photoresist layer before UV exposure, to expose another portion of the photoresist layer a selected overlap distance within the island structure shadow; and removing the exposed photoresist portion to form a mask which is aligned with the island structure and narrower than the island structure by the selected overlap distance on each side thereof.

26 Claims, 7 Drawing Sheets

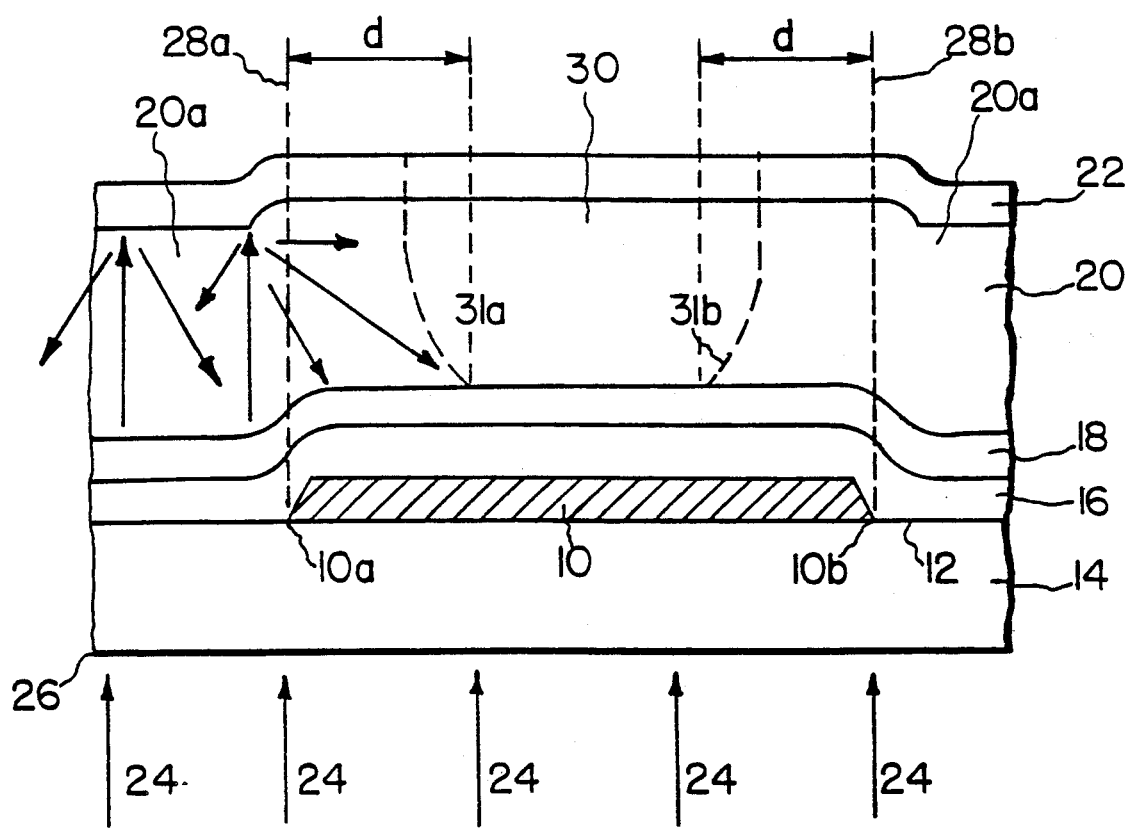
FIG. IA

METHOD FOR PHOTOLITHOGRAPHICALLY FORMING A SELFALIGNED MASK USING BACK-SIDE EXPOSURE AND A NON-SPECULAR REFLECTING LAYER

BACKGROUND OF THE INVENTION

The present invention relates to photolithographic techniques employed in the fabrication of semiconductor devices and, more particularly, to a method of photolithography utilizing back-side exposure and non-specular reflection to provide self-alignment of device constituents.

One example of a semiconductor device where proper alignment of the device constituents is important is the thin-film field-effect transistor (FET). The source electrode, the drain electrode or both should overlap the gate electrode by a selected distance, preferably about 1-10 microns, for optimal device performance. An excessive overlap distance causes a large source/drain-to-gate (S/D-G) capacitance and in turn causes higher transistor noise and lag in imager-type devices using thin-film FETs as switching elements. Increased S/D-G capacitance may also contribute to offset-voltage errors in liquid crystal display (LCD) devices when individual picture elements (pixels) are switched between operative and inoperative states; the charge that remains in the S/D-G capacitance when the pixel is turned-off may have to be compensated to actually switch the pixel to the inoperative state. The compensating voltage required will be determined by the S/D-G capacitance and may vary from one pixel to another in a LCD device if the S/D-G capacitance varies.

Typically, the S/D-G overlap is designed to be larger than necessary to allow for photolithographic alignment errors in the photoresist mask formed during device fabrication and to ensure a sufficiently adequate overlap width to provide an acceptable contact or on-resistance. A S/D-G overlap width shorter than an optimum value may also cause the saturation drain current of the FET to fluctuate outside of acceptable limits. Thus, it is desirable to control the overlap between the S/D electrodes and the gate electrode to an optimum width that is neither too long nor too short.

One fabrication step that is critical in controlling the S/D-G overlap distance is the formation of the photoresist mask used for patterning the top insulation layer of an FET; the mask must have an optimum width and be aligned with the gate electrode to provide the optimum S/D-G overlap distance. If the mask width is too short or too long, or the mask is misaligned relative to the gate electrode, etching errors will occur when the top insulation layer is patterned and the source and drain electrodes will be misaligned relative to the gate electrode.

It is accordingly a primary object of the present invention to provide a novel method for fabricating a semiconductor device with self-aligned constituents which is not subject to the foregoing disadvantages.

It is another object of the present invention to provide a novel method for fabricating a self-aligned thin-film transistor which controls the overlap distance of the gate electrode with each of the source and drain electrodes to an optimum distance.

It is a further object of the present invention to provide a mask for fabricating a device with self-aligned constituents.

These and other objects of the invention, together with features and advantages thereof, will become apparent from the following detailed specification when read with the accompanying drawings in which like reference numerals refer to like elements.

SUMMARY OF THE INVENTION

In accordance with the invention, a method for forming a mask for use in fabricating a self-aligned semiconductor device includes the steps of: forming an island structure of opaque material on a principal surface of a transparent substrate; depositing at least one layer of transparent material over the opaque island; depositing a layer of photoresist material over the at least one layer of material; depositing a layer of non-specular material over the photoresist layer; exposing a back-side substrate surface, opposite to the principal substrate surface, to ultra-violet (UV) light for a duration selected to cause exposure of at least a portion of the photoresist substantially corresponding to an area outside of the island structure shadow; reflecting at least a portion of UV light from the non-specular layer to expose another portion of the photoresist a selected distance within the island structure shadow; and removing the exposed photoresist portions to form a mask aligned with the island structure and narrower than the island structure by a selected overlap distance on each side thereof. The mask may be used either for depositing another layer of material with portions overlying the island structure for the selected overlap distance or for patterning the at least one layer of material.

BRIEF DESCRIPTION OF THE DRAWINGS

FIGS. 1A–1E are cross-sectional, side elevation views of the steps employed in fabricating a mask in accordance with the photolithographic method of the present invention.

DETAILED DESCRIPTION OF THE PREFERRED EMBODIMENTS

Figure 1B:
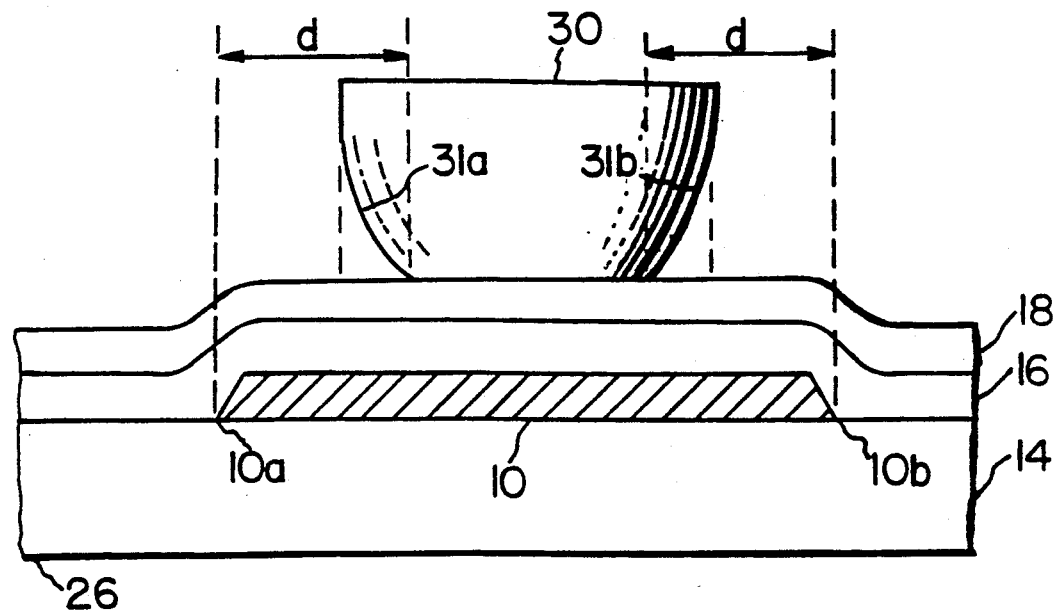

Referring initially to FIG. 1A, an island structure 10 of opaque material is formed on a principal surface 12 of a substrate 14 formed of an insulative transparent material, such as glass and the like. Island structure 10 may be a gate electrode for a field-effect transistor (FET) or other device component which should be aligned with another device component to be subsequently formed.

At least one layer 16 of material is deposited on principal surface 12 over island structure 10; for example, in the fabrication of an FET, a first layer 16 of insulation material may be deposited on principal surface 12 and over a gate electrode (island structure 10) and a second layer 18 of semiconductor material may be deposited on first layer 16.

In accordance with the present invention, as seen in FIG. 1A, a layer 20 of positive photoresist material is deposited over second layer 18 and a layer 22 of non-specular reflecting material is deposited over photoresist layer 20. In a presently preferred embodiment, the photoresist layer may be about 2 microns thick. The non-specular reflecting material is preferably a dispersion of particles of a highly reflective metal or a high-optical index dielectric, such as $TiO_2$, $BaSO_4$ or the like, in an aqueous solution containing polymers, such as poly-vinyl alcohol, gelatin and the like, to minimize interaction with the photoresist. The aqueous solution, with reflective particles dispersed therein, may be applied to photoresist layer 20 by spin coating, spraying or the like. Ultra-violet (UV) radiation (indicated by arrows 24) is applied to the back-side surface 26 of substrate 14, opposite to principal substrate surface 12. The UV radiation passes through substrate 14 and layers 16 and 18 to expose a photoresist layer portion 20a corresponding substantially to an area (indicated by broken lines 28a and 28b) outside of the edges 10a and 10b of island 10. Non-specular layer 22 reflects and scatters a portion of the UV radiation incident upon layer 22 back into the photoresist to cause exposure of photoresist layer 20 at least a selected distance d within each edge 10a and 10b of island 10. The size of the particles should be smaller than the desired dimensional distance being controlled (i.e. selected distance d) to assure uniform scattering of the reflected light on the same scale; for example, the particle size should be less than 1 micron to assure uniform scattering on a micron scale. The shape of non-specular layer 22 may cause the reflected and scattered UV light to expose a greater portion of the photoresist proximate to second layer 18 such that a substantially bowl-shaped portion 30 (bounded by lines 31a and 31b in FIG. 1A) of photoresist layer 20 is unexposed. Selected distance d will be a function of the reflectivity of layer 22, the thickness of photoresist layer 20 and the duration and intensity of the UV exposure.

As seen in FIG. 1B, after UV exposure of photoresist layer 20, the exposed photoresist is developed and removed, to leave the unexposed photoresist portion 30, which constitutes a mask for use in subsequent processing steps. The exposed photoresist may be overdeveloped, either in addition to UV overexposure or alternately thereto, to further reduce the width of mask 30 and to control selected distance d. Selected distance d may be between about 1 and about 10 microns, depending upon the process variables described above.

Non-specular layer 22 may be removed from photoresist layer 20 by dissolving with water, a solvent or the like, after UV exposure, to avoid possible interference or process compatibility problems with subsequent processing steps.

Figure 1C:
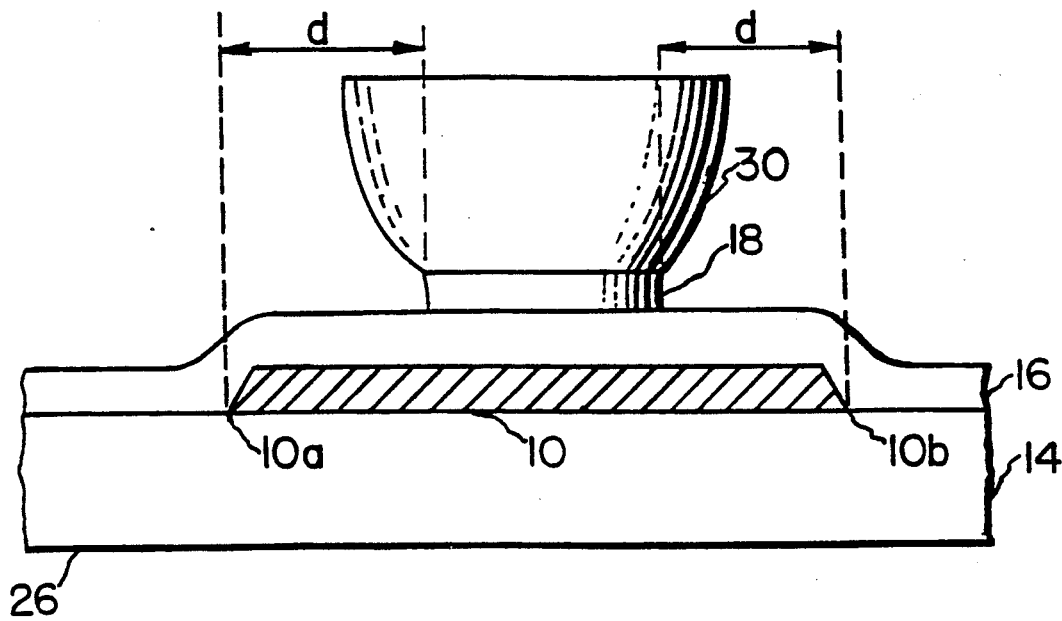
Figure 1D:
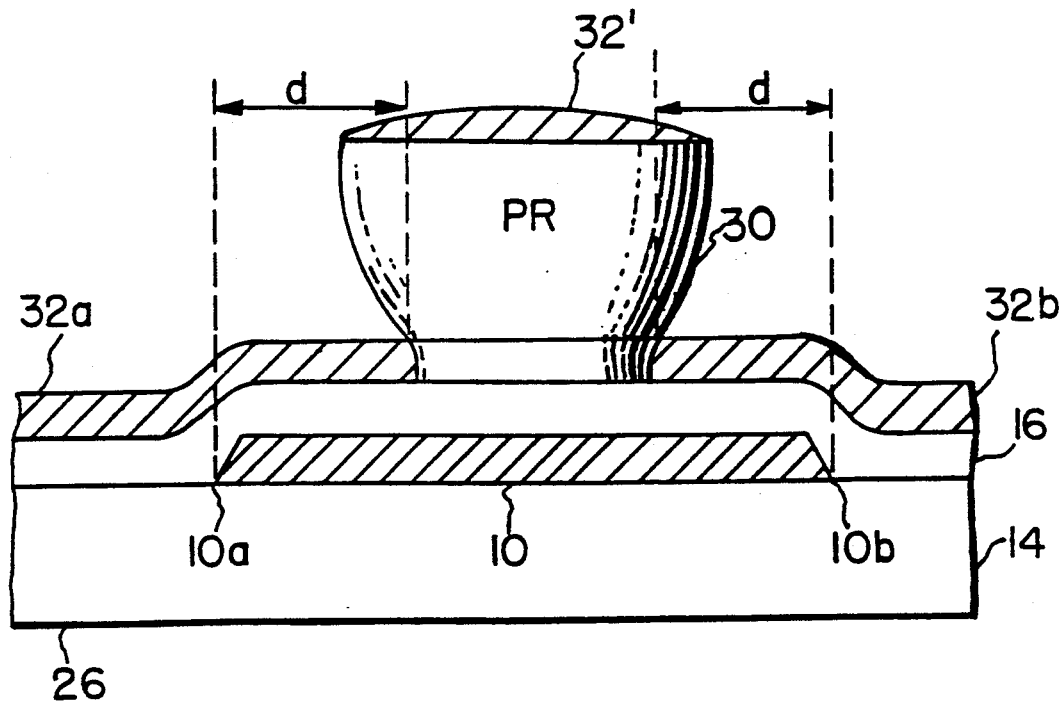
Figure 1E:
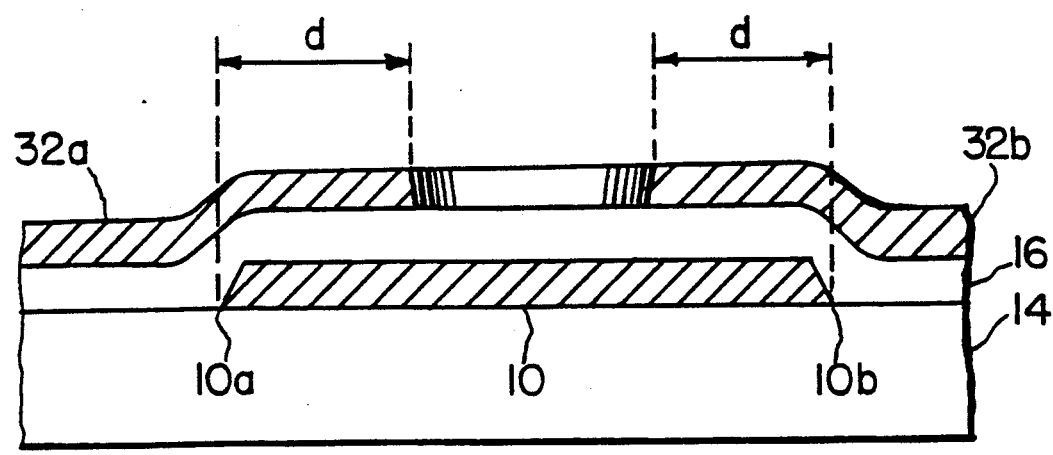

Mask 30 may be used to pattern layer 18 (FIG. 1C) and/or, as shown in FIG. 1D to deposit another layer 32 of material, such as metallization and the like, on layer 16 and on mask 30 (or on layer 18 if it is not patterned). A portion 32' of layer 32 will be removed by lift-off when photoresist mask 30 is stripped to leave the resulting structure shown in FIG. 1E. Portions 32a and 32b of layer 32 will be self-aligned with island 10 and will overlap island 10 by at least a selected overlap distance d', as shown in FIG. 1E.

In a presently preferred embodiment, non-specular reflecting layer 22 may be formed by dispersing about 20 wt. % to about 30 wt. % of $TiO_2$ powder into 20% gelatin and water; the resulting solution is then spin coated on photoresist layer 20 at spin speeds from about 500 rpm to about 1000 rpm for between 8 seconds and about 30 seconds to form a layer several microns thick. The gelatin is preferably air dried at room temperature for about 2 hours to produce a film comprising at least about 50% $TiO_2$ particles. The gelatin may also be dried by soft baking at about 90° C. or less for about 5 minutes; some disruption in contact between photoresist layer 20 and non-specular layer 22 may result from heating, but with little or no apparent change in the dimensions of photoresist layer 20.

After UV exposure, the gelatin layer just described may be removed with warm or hot water and gentle rubbing with a soft clean cloth or the like to prevent possible interference with subsequent processing steps; after removing the gelatin layer, the photoresist may be developed for about 25 seconds at about room temperature.

As a further example, the method of the present invention may be utilized in the fabrication of a thin-film transistor (TFT) as shown in FIGS. 2A-2I.

Figure 2A:
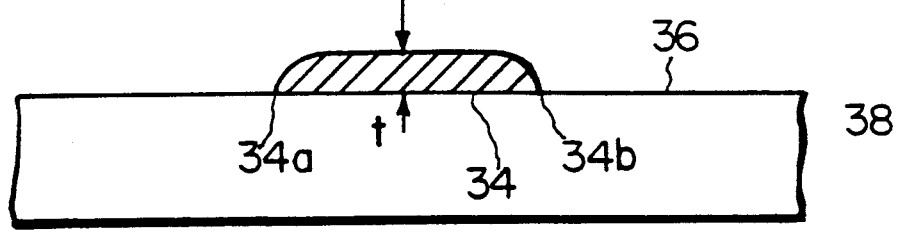
FIGS. 2A–2I are cross-sectional, side elevation views of the steps employed in the fabrication of a thin-film transistor (TFT) using the photolithographic method of the present invention.

Referring initially to FIG. 2A, a gate electrode 34 is formed on a principal surface 36 of a substrate 38, formed of an insulative transparent material, such as glass and the like. The gate electrode may be a single conductive layer of a metal, such as titanium (Ti), chromium (Cr), tungsten (W), aluminum (Al) and the like, or may be a multilayer structure, such as titanium over molybdenum (Ti/Mo), titanium over aluminum (Ti/Al), chromium over aluminum (Cr/Al), chromium over molybdenum (Cr/Mo) and the like, to provide good adhesion to substrate 14 and low electrical resistance. The side edges 34a and 34b of gate electrode 34 are preferably tapered by known wet or dry etching techniques to improve the step coverage, over the gate electrode edges, of subsequently deposited layers of material. Gate electrode 34 preferably has a thickness "t" between about 100 nm and about 500 nm.

Figure 2B:
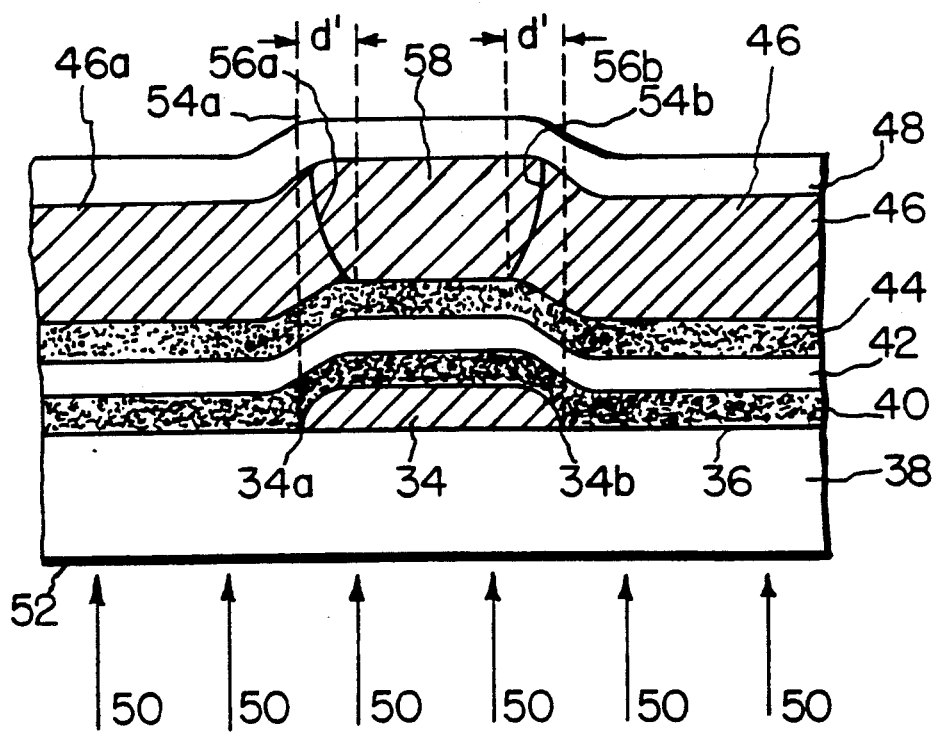

In FIG. 2B, a first layer 40 of insulation material is deposited to a thickness of about 100 nm to about 600 nm on principal substrate surface 36 and over gate electrode 34; a layer 42 of semiconductor material, such as intrinsic amorphous silicon (i-Si), amorphous germanium (a-Ge), polycrystalline semiconductor material or the like, is deposited on first insulation layer 40 to a thickness of between about 20 nm and about 200 nm by a known technique, such as plasma enhanced chemical vapor deposition (PECVD) and the like. A second insulation layer 44 is deposited over semiconductor layer 42 to a thickness of about 100 nm to about 800 nm. The first and second insulation layers may be formed of one or more layers of a silicon nitride ($SiN_x$), a silicon oxide ($SiO_x$), a silicon nitrate ($SiN_xO_y$) or other suitable dielectric material deposited by known techniques, such as PECVD and the like.

In accordance with the present invention, as seen in FIG. 2B, a layer of positive photoresist material 46 is deposited over second insulation layer 44 and a layer 48 of non-specular reflecting material is deposited over photoresist layer 46. Layer 48 may be particles of a highly reflective metal, a high-optical index dielectric or the like dispersed in an aqueous solution as previously described. Ultra-violet (UV) radiation (indicated by arrows 50) is applied to the back-side surface 52 of substrate 38, opposite to principal substrate surface 36, and passes through substrate 38 and layers 40, 42 and 44 to expose a portion 46a of the photoresist corresponding substantially to an area (indicated by broken lines 54a and 54b in FIG. 2B) outside of the gate electrode edges. Reflecting layer 48 scatters a portion of the UV radiation back into photoresist layer 46 to cause exposure of the photoresist a selected distance d' within the shadow of gate electrode 34. A substantially bowl-shaped portion 58 of photoresist layer 46, which may narrow near second insulation layer 44 and is bounded by lines 56a and 56b, is unexposed by the UV radiation. After UV exposure, non-specular reflecting layer 48 may be removed to avoid process incompatibility with subsequent processing steps.

Figure 2C:
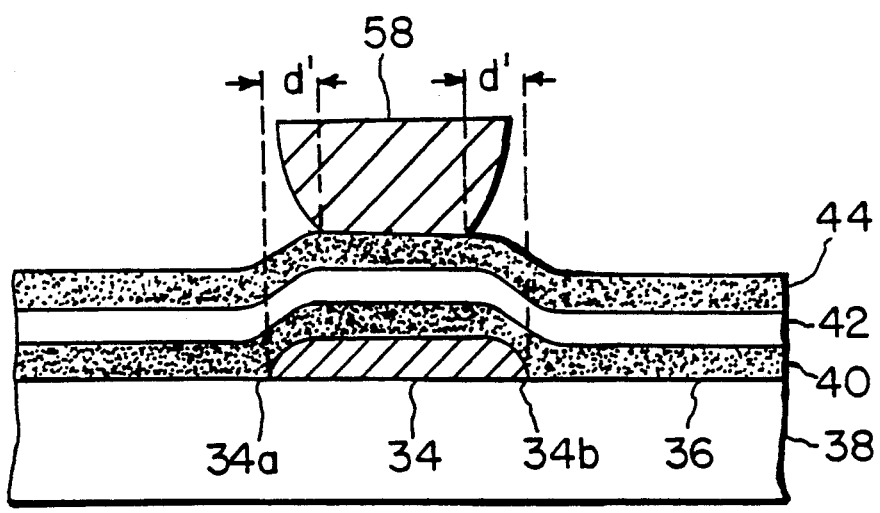

As seen in FIG. 2C, after UV exposure of photoresist layer 46, the exposed photoresist is developed and removed, to leave the substantially bowl-shaped photoresist portion 58. The exposed photoresist may be over-developed, either in addition to UV overexposure or alternatively thereto, to further reduce the width of the remaining photoresist portion 58 and to control selected overlap distance d'. Selected distance d' is preferably from about 1 micron to about 10 microns.

Figure 2D:
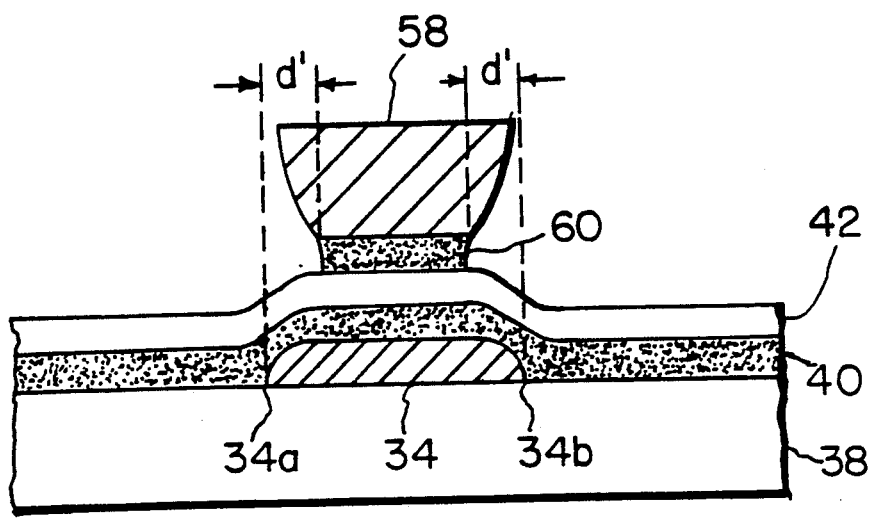

Referring now to FIG. 2D, those portions of second insulation layer 44 which are now no longer masked by photoresist are removed by known etching techniques. For example, if second insulation layer 44 is $SiN_x$ or $SiO_x$, it may be etched by buffered hydrofluoric acid (BHF) or hydrofluoric acid (HF). Second insulation layer 44 may, in accordance with the present invention, be over-etched to undercut remaining photoresist portion 58 to reduce the width of remaining second insulation segment 60 and to further control selected overlap distance d'. Selected distance d' may then be controlled by the following process variables (1) overexposure of the resist, (2) overdevelopment of the resist, (3) overetching second insulation layer 20, (4) reflectivity of reflecting layer 48, and (5) thickness of photoresist layer 46; these process variables may be applied either individually or in combination to control selected distance d'. Remaining photoresist portion 58 is removed after second insulation layer 44 is etched.

In some applications, such as x-ray, optical or charged particle imagers or liquid crystal display (LCD) devices, it is desirable to pattern semiconductor layer 42 before the source/drain (S/D) metallization layer is deposited, to minimize the semiconductor material area under the S/D metallization and to provide additional area on the substrate for other components, such as pixel electrodes and the like. Semiconductor layer 42 may be patterned either at this point in the fabrication process or after a doped semiconductor layer 62 is deposited (FIG. 2E), in which latter case both layers 42 and 62 will be etched in the same masking step; both of these alternative embodiments of the present invention are described and claimed in a U.S. patent application entitled "A Method for Fabricating a Self-Aligned Thin-Film Transistor Utilizing Planarization and Back-Side Photoresist Exposure," U.S. Pat. No. 5,010,027, issued Apr. 23, 1991, assigned to the same assignee as the present invention and incorporated herein in its entirety by reference.

Figure 2E:
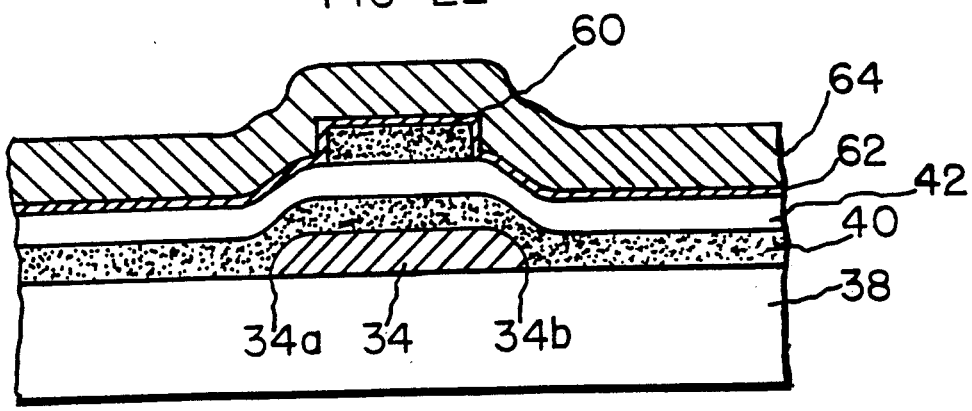

If it is not desirable or necessary to pattern semiconductor layer 42, a S/D metallization layer 64 is deposited over doped semiconductor layer 62 (FIG. 2E). Doped semiconductor layer 62 is preferably of n+ type conductivity, as provided by phosphorous doped amorphous silicon, and is deposited to a thickness between about 10 nm and about 200 nm. Layer 62 thus forms a contact between the S/D metallization layer 64 and underlying semiconductor layer 42. The S/D metallization may be a contact metal, such as molybdenum (Mo), chromium (Cr) and the like, deposited by sputtering or other known methods to a thickness between about 100 nm and about 500 nm.

Figure 2F:
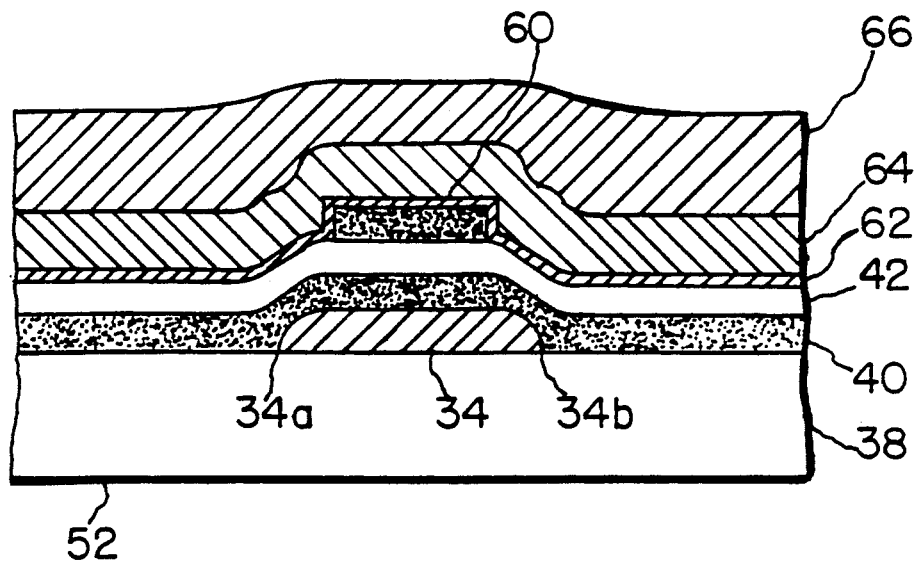
Figure 2G:
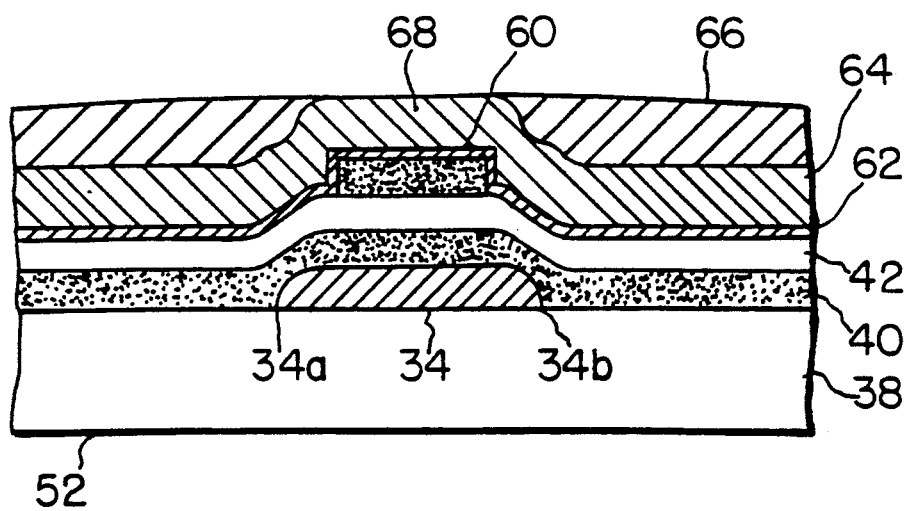
Figure 2H:
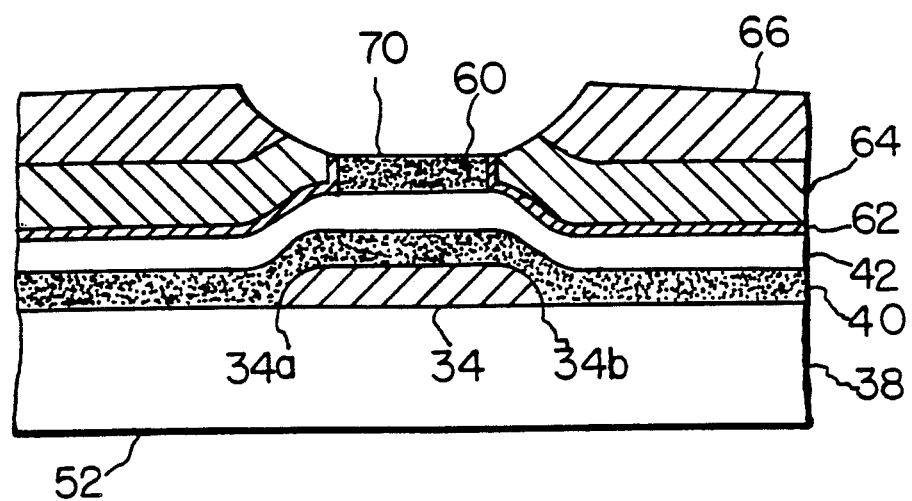
Figure 2I:
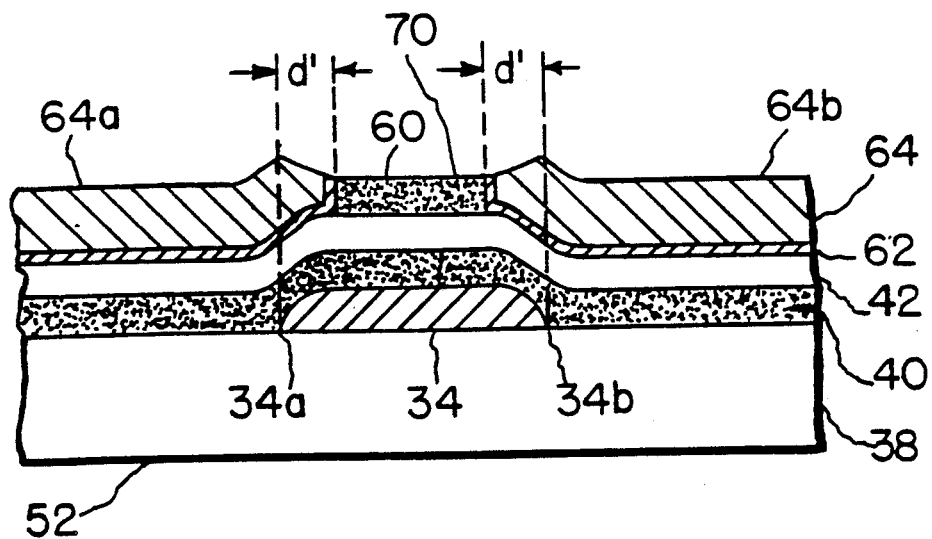

As shown in FIG. 2F and in accordance with another aspect of the present invention, a layer 66 of planarization material, such as photoresist material and the like, is deposited substantially completely over the entire wafer. Planarization layer 66 is then non-selectively etched back using a planarization etch, such as a reactive ion etch (RIE) or the like. In a presently preferred embodiment, planarization layer 66 is dry etched to expose a top portion 68 of S/D metallization layer 64 (FIG. 2G); exposed S/D metallization layer 64 and doped semiconductor layer 62 may then be selectively etched, using the patterned planarization layer as a mask, until a top portion 70 of remaining second insulation segment 60 is exposed (FIG. 2H). The remainder of planarization layer 66 may then be stripped (FIG. 2I). Etched layers 64 and 62 form self-registered source and drain electrodes 64a and 64b, which each respectively overlap gate electrode 34 by selected distance d' (FIG. 2I); selected distance d' is chosen to minimize S/D-G capacitance while still providing acceptable contact resistance. S/D metallization layer 64 may be further patterned (not shown) subsequent to the step shown in FIG. 2I, or alternatively, layer 64 may be patterned prior to the deposition of planarization layer 40 (FIG. 2F), as desired according to the application of the FET device.

It will be readily understood by those skilled in the art that the present invention is not limited to the specific embodiment described and illustrated herein. Different embodiments and adaptations besides those shown herein and describe, as well as many variations, modifications, and equivalent arrangements will now be apparent or will be reasonably suggested by the foregoing specification and drawings, without departing from the substance or scope of the invention. While the present invention has been described herein in detail in relation to its preferred embodiments, it is to be understood that this disclosure is only illustrative and exemplary of the present invention and is made merely for purposes of providing a full and enabling disclosure of the invention. Accordingly, it is intended that the invention be limited only by the spirit and scope of the claims amended hereto.

What is claimed is:

1. A method for forming a mask, comprising the steps of:
    (a) forming an island structure of opaque material on a principal surface of a transparent substrate;
    (b) depositing at least one layer of a transparent material on the principal substrate surface and over the island structure;
    (c) depositing a layer of photoresist material having a selected thickness over the at least one layer;
    (d) depositing a layer of a substantially non-specular reflective material over said layer of photoresist;
    (e) exposing a back-side substrate surface, opposite to the principal substrate surface, to ultra-violet (UV) light of a selected intensity for a selected duration such that the opaque island structure casts a shadow thereby exposing a portion of the photoresist layer corresponding substantially to an area outside of the boundaries of the shadow of the island structure; and
    (f) removing the exposed photoresist portions by selective development to form a mask which is aligned with the island structure and is narrower than the island structure by the selected overlap distance on each side thereof.

2. The method of claim 1, wherein step (d) comprises the step of selecting the duration and intensity of UV exposure to reflect UV light from the non-specular layer to extend the exposed photoresist portion to the selected overlap distance at each side of the island structure shadow.

3. The method of claim 1, wherein the non-specular layer depositing step is a selected one of spin coating and spraying.

4. The method of claim 1, wherein the non-specular layer comprises a multiplicity of particles, of at least one of a highly reflective metal and a high-optical index dielectric, dispersed in a polymeric solution.

5. The method of claim 4, wherein each of the multiplicity of particles is smaller than the selected overlap distance.

6. The method of claim 4, wherein the polymeric solution comprises at least one of poly-vinyl alcohol and gelatin.

7. The method of claim 4, wherein the multiplicity of particles each comprises at least one of $TiO_2$ and $BaSO_4$.

8. The method of claim 1, wherein the non-specular layer depositing step comprises the steps of:
dispersing $TiO_2$ powder into a solution of water and gelatin to form a combined solution;
applying the combined solution by one of spin coating and spraying, to form the non-specular layer; and
drying the non-specular layer at a selected temperature for a chosen duration.

9. The method of claim 8, wherein the combined solution comprises between about 20 wt. % and about 30 wt. % of $TiO_2$ dispersed in a solution comprising water and about 20% gelatin.

10. The method of claim 8, wherein the selected temperature is between about 10° C. and about 90° C. and the chosen duration is between about 5 minutes and about 2 hours.

11. The method of claim 8, wherein the applying step comprises spin coating the combined solution at between about 500 rpm and about 1000 rpm for between about 8 seconds and about 30 seconds.

12. The method of claim 1, wherein the non-specular layer comprises at least about 50% $TiO_2$ particles.

13. The method of claim 1, further comprising the step of removing the non-specular layer after steps (d) and (e).

14. The method of claim 13, wherein step (f) comprises the step of developing the photoresist for about 25 seconds at about room temperature after the non-specular layer is removed.

15. The method of claim 1, wherein the photoresist layer is about 2 microns thick.

16. The method of claim 1, wherein step (f) comprises the step of selectively overdeveloping the exposed photoresist portions to cause the mask to be shorter, on each side thereof, than the island structure by the selected overlap distance.

17. The method of claim 1, wherein the selected overlap distance is a function of at least one of: the selected thickness in step (c), the selected intensity of step (e), the selected duration of step (e), the selected quantity of UV light reflected in step (e) and the selective development of step (f).

18. A method for fabricating a thin-film transistor, comprising the steps of:
(a) forming an opaque gate electrode on a principal surface of a transparent substrate;
(b) depositing a first layer of insulation material on the principal substrate surface and over the gate electrode;
(c) depositing a layer of semiconductor material on the first insulation layer;
(d) depositing a second layer of insulation material on the semiconductor layer;
(e) depositing a first layer of photoresist on the second insulation layer;
(f) depositing a layer of a substantially non-specular reflective material over said first layer of photoresist.
(g) exposing a back-side substrate surface, opposite to the principal substrate surface, to UV light of a selected intensity for a selected duration such that said opaque gate electrode casts a shadow thereby exposing a portion of the first photoresist layer substantially outside of the boundaries of the shadow of the gate electrode and causing exposure of an additional portion of said photoresist layer within a selected overlap distance form said boundaries of said shadow formed by the illumination of the gate electrode, said additional portion of said photoresist layer being exposed by UV light reflected and scattered from said non-specular reflective layer;
(h) removing at least the exposed first photoresist portions by selective development to leave a first remaining photoresist portion and to expose a segment of the second insulation layer not covered by the first remaining photoresist portion;
(i) selectively etching the second insulation layer segment to leave a remaining second insulation segment, under the first remaining photoresist portion, and to expose a portion of the semiconductor layer not covered by the remaining second insulation segment being aligned with the gate electrode and being narrower than the gate electrode by a selected overlap distance on each side thereof;
(j) removing the first remaining photoresist portion;
(k) depositing a layer of doped semiconductor material on the exposed semiconductor portion and over the remaining second insulation segment;
(l) depositing a layer of conductive material on the doped semiconductor material;
(m) selectively etching a portion of the conductive layer and a portion of the doped semiconductor layer to expose at least a top surface of the remaining second insulation segment and to form self-registered source and drain electrodes from the etched conductive layer which each overlap the gate electrode the selected overlap distance.

19. The method of claim 18, wherein step (g) comprises the step of selecting the duration and intensity of UV exposure to reflect UV light from the non-specular layer and to extend the exposed photoresist portion to the selected overlap distance at each side of the island structure shadow.

20. The method of claim 19, wherein the selected overlap distance is a function of at least one of the group consisting of: the thickness of the gate electrode, the selected intensity of said UV exposure, the selected duration of said UV exposure, the portion of UV light reflected from said non-specular layer, the duration of the selective development of said exposed first photoresist portions, and the duration of the selective etching of said second insulation layer segment.

21. The method of claim 18, wherein the non-specular layer depositing step is a selected one of spin coating and spraying.

22. The method of claim 18, wherein the non-specular layer comprises a multiplicity of particles, of at least one of a highly reflective metal and a high-optical index dielectric, dispersed in an aqueous polymeric solution.

23. The method of claim 13, wherein the multiplicity of particles each comprise at least one of $TiO_2$ and $BaSO_4$.

24. The method of claim 18, wherein the non-specular layer comprises at least about 50% $TiO_2$ particles.

25. The method of claim 18, wherein the selected overlap distance is between about 1 and about 2 microns.

26. The method of claim 18, wherein step (m) comprises the steps of:
    depositing a planarization layer on the conductive layer; and
    nonselectively etching the planarization layer to expose a top surface of the conductive layer portion.

* * * * *